United States Patent [19]
Cerrina et al.

[11] Patent Number: 5,536,559
[45] Date of Patent: Jul. 16, 1996

[54] STRESS-FREE MOUNT FOR IMAGING MASK

[75] Inventors: Franco Cerrina, Madison; John P. Wallace, Oregon, both of Wis.

[73] Assignee: Wisconsin Alumni Research Foundation, Madison, Wis.

[21] Appl. No.: 343,126

[22] Filed: Nov. 22, 1994

[51] Int. Cl.⁶ .................................................. B32B 9/00
[52] U.S. Cl. ............................... 428/192; 279/3; 269/21; 428/195
[58] Field of Search .................................... 428/209, 210, 428/688, 689, 701, 702, 192, 195; 279/3; 269/21; 248/466; 29/445, 840

[56] References Cited

U.S. PATENT DOCUMENTS

| | | | |
|---|---|---|---|
| 3,158,381 | 11/1964 | Yamamura | 279/3 |
| 3,943,778 | 3/1976 | Wyse | 29/445 |
| 4,006,909 | 2/1977 | Ollendorf | 279/3 |
| 4,088,312 | 5/1978 | Frosch | 269/21 |
| 4,357,006 | 11/1982 | Hayes | 269/21 |
| 4,497,465 | 2/1985 | Yeakley | 248/466 |
| 4,506,184 | 3/1985 | Siddall | 279/3 |
| 4,747,608 | 5/1988 | Sato | 279/3 |
| 4,893,403 | 1/1990 | Heflinger | 29/840 |

FOREIGN PATENT DOCUMENTS

| | | | |
|---|---|---|---|
| 54-58365 | 11/1979 | Japan | 269/21 |

OTHER PUBLICATIONS

Paros et al., How to design Flexure Hinges, *Machine Design*, pp. 151–156, Nov. 25, 1965.

Scire et al., Piezodriven 50μm range stage with subnanometer resolution, *Rev. Sci. Instrum.* 49(12), pp. 1735–1740, Dec. 1976.

Wallace et al. A novel aligner for X–ray lithography, *Nuclear Instruments and Methods in Physics Research*, A319, pp. 371–375, 1992.

Drawing entitled "IBM Mask".

Drawing entitled "Example of Sperry Mask Mount One of Three Vacuum Holding Cups".

*Primary Examiner*—Patrick Ryan
*Assistant Examiner*—Patrick Jewik
*Attorney, Agent, or Firm*—Bell, Seltzer, Park & Gibson

[57] ABSTRACT

An imaging mount and apparatus that reduces or eliminates stress induced in an imaging mask mounted thereto. The mount comprises a support block and a trio of mounting pads connected thereto. At least two of the mounting pads are connected to the support block so that their respective positions are adjustable within a predetermined plane which is preferably substantially parallel to a surface of a substrate to be imaged. Each of the mounting pads including means for securing the imaging mask generally parallel to the predetermined plane. The positions the adjustable mounting pads adjust within the predetermined plane responsive to securing of the lithography mask thereto so that the imaging mask is essentially undeflected due to the securing thereof. The absence of deformation (and, as a result, stress) in the imaging mask due to its being secured to the mount reduces the degree of distortion of radiation passing through the mask and to the imprinted surface.

25 Claims, 4 Drawing Sheets

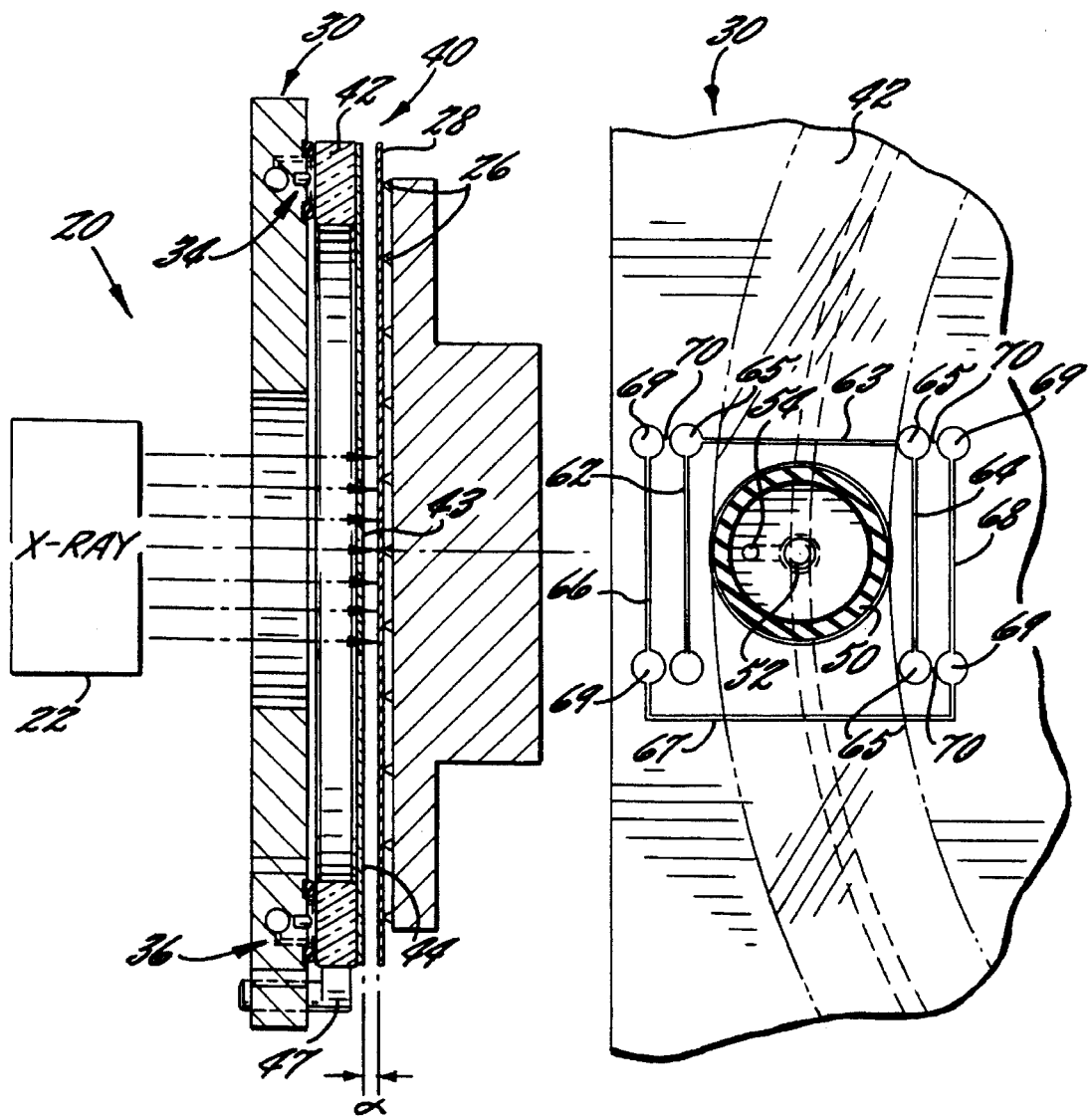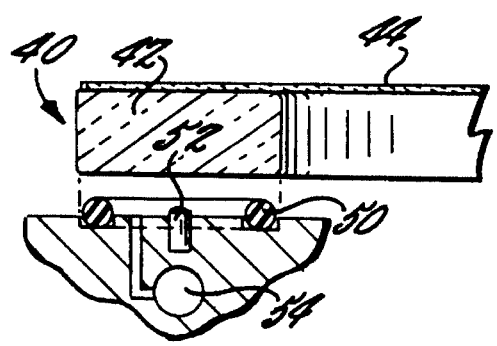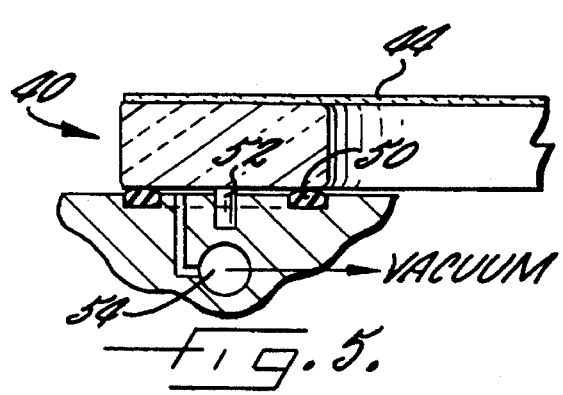

STRESS-FREE MOUNT FOR IMAGING MASK

FIELD OF THE INVENTION

This invention relates generally to imaging, and relates more specifically to a device for mounting an imaging mask.

BACKGROUND OF THE INVENTION

Lithography is a commonly used technique for etching a desired pattern into a substrate. Typically, the substrate to be etched is secured into place with a vacuum chuck or other securing device opposite a radiation source. A lithography mask is mounted between the radiation source and the substrate. The lithography mask is formed of a material that is opaque to radiation produced by the source but includes a radiation-transparent window with an opaque pattern. When the radiation source is activated, radiation emitted therefrom travels through the transparent portions of the window to the substrate but is prevented from passing through the opaque portions. A photoresist on the substrate is exposed in the desired pattern by the radiation passing through the transparent portions of the mask window. The photoresist is then developed and then used as a mask to etch the substrate.

In the lithography imaging process, particularly for the production of microelectronic components, patterns recorded onto photo-resist covered semiconductor wafers should be precisely positioned relative to pre-existing structures. For example, in 1 X proximity lithography, variations of only a few nanometers over a pattern area of up to 50 millimeters×50 millimeters are permissible for acceptable pattern definition. Any stress present in the lithographic mask can distort the X-ray image and thus render the registration of the pattern with the substrate to be unacceptable. Such stress can be induced by many sources, including the actual gripping of the mask by its mounting structure. In particular, stress can be induced in the mask by a mismatch of the mask and its mounting structure. If the mask itself is not planar, or if the mounting structure includes mounting surfaces that are not coplanar, the mask may be required to deform in order to be secured. Often, sufficient deformation (and, as a result, stress) is induced in the mask to adversely affect imaging.

One solution to reducing or eliminating stress in a mask through the design of its mounting structure stems from recognizing that any rigid planar or nonplanar surface can be supported at three points without further deformation. In addition, the stress in a mask can be reduced by enabling three such support points to move in such a way as to comply with any inplane dimensional changes of either the mask or mask mount (such as those unused by thermal expansion) after the two are joined. These three points must be compliant, yet must constrain the mask sufficiently to maintain a precise location relative to a mounting device for the mask.

Mask mounts exist which attempt to address these design parameters, with the methods of holding and providing compliance differing between the mount designs. Designs for X-ray lithography mask mounts generally employ a mask-to-wafer gap of typically 10–50 micrometers. This gap precludes the use of any holding or clamping hardware from being located on the mask front (wafer side) surface. One mask mount design has a mask with a thin, radially outwardly projecting lip. This lip is located nearer to the mount than the plane defined by the mask front surface. The mask is attached to a cassette by three clamps, each of which pinches a portion of the mask outer lip to hold the mask in place. All clamps are 120° apart and include a ball bearing that contacts the surface of the mask lip. In one clamp, the ball bearing is nested within an indented ball seat in the mask ring, and thus does not allow that mask mount point to move relative to the cassette. Another clamp is designed so that its ball fits within a linear V-groove channel on the mask lip. This clamp allows the mask to move relative to the cassette, in a direction defined by the V-groove. The third clamp is made so that its ball contacts on a flat surface on the mask lip, and thus is able to move in any direction parallel to the flat surface. The in-plane compliance achieved via the ball seat, V-groove and flat are referred to as a 1-2-3 kinematic mount. Once the mask is loaded within the cassette, the cassette is then attached to the stepper using a full surface vacuum chuck.

This design has certain shortcomings. The use of this mount is limited to masks that have a radially outwardly extending lip and the described ball grooves. This mask format is new and would require industry to forego existing mask formats and retool for this new format. In addition, finite element modeling has indicated that misalignment of the clamping pinchers could torque and distort the mask. This mask is more massive, which could lead to greater distortions due to gravitational sag; also, greater mask mass can negatively impact the performance of future mask/wafer aligners, which may have fast alignment stages which, in order to provide fast response time, should employ low inertia masks.

In a second design, the mask mount includes three metal vacuum cups, each of which pivots about a ball and socket joint. The mask is attached by suction to the rim of each cup. The cups are able to pivot in any direction to conform to the plane of the mask. However, their movement is not limited to directions parallel to the plane of the mask, as any pivoting by a cup distorts the attached mask out of its natural plane. In addition, because none of the cups are fixed into position, errors in remounting can lead to inconsistent imaging. Air leaks occurring at the metal cup rim will also generate vibrations, which distort the image.

In another design, a vacuum groove is machined into a metal plate. The mask ring and plate make full surface contact; the vacuum is applied to secure the mask to the plate. If nonplanarities exist between the mask ring and the vacuum plate, the ring will comply with the stiff plate surface and induce stress in the mask.

SUMMARY OF THE INVENTION

In view of the foregoing, it is an object of the present invention to provide a mask mount that induces little to no stress in a mask mounted thereto.

It is also an object of the present invention to provide a mount upon which masks having nonplanarities can be mounted without inducing stress.

It is a further object of the present invention to provide a mount that does not overconstrain the mask or cause post-mask mounting distortions.

It is shall be an object of the present invention to provide a microelectronic imaging apparatus that utilizes such a mask mount.

These objects and others are satisfied by the present invention, which provides a mask mount and apparatus that reduces or eliminates stress induced by mounting in an imaging mask mounted thereto. The mount comprises a support block and a trio of mounting pads connected thereto.

At least two of the mounting pads are connected to the support block so that their respective positions are adjustable within a predetermined plane which is preferably substantially parallel to a surface of a substrate to be imprinted. Each of the mounting pads includes means for securing an imaging mask generally parallel to the predetermined plane. The positions of the adjustable mounting pads adjust within a predetermined plane responsive to post-mask mounting planar dimensional changes in either the mask or the mask mount. This mount provides sufficient constraints to hold a mask in a precise location without overconstraining it. The absence of stress on the mask will yield a reduced degree of distortion of the radiation passing through the mask and on to the imaged surface.

In one embodiment, the mount comprises two adjustable mounting pads. A first of these adjustable mounting pads is adjustable in a first linear direction, and the second is adjustable in the first linear direction and in a second linear direction that is perpendicular to the first linear direction. Preferably, the mount further comprises a flexural hinge that connects the first mounting pad to the support block and a pair of perpendicularly oriented cooperating flexural hinges connecting the second mounting pad to the support block.

In another embodiment, the mount comprises three adjustable mounting pads, each of which is adjustable in a respective linear direction. Each of the linear directions is separated by approximately 120 degrees from each of the other linear directions. Preferably, a trio of flexural hinges connects a respective one of the trio of mounting pads.

BRIEF DESCRIPTION OF THE DRAWINGS

FIG. 2 is a cross-sectional side view of the lithography assembly of FIG. 1.

FIG. 3 is an enlarged top view of a unidirectional mounting pad of a lithography mount.

FIG. 4 is a cross-sectional side view of a lithography mask in position for securing to a mounting pad of a lithography mount.

FIG. 5 is a cross-sectional side view of a lithography mask secured to a mounting pad.

DETAILED DESCRIPTION OF THE INVENTION

The present invention will now be described in greater detail hereinbelow. This invention may be embodied in many forms and should not be construed as limited to the embodiments set forth herein; rather, these embodiments are provided so that this disclosure will be thorough and complete and will fully convey the scope of the invention to those skilled in this art.

Figure 1:
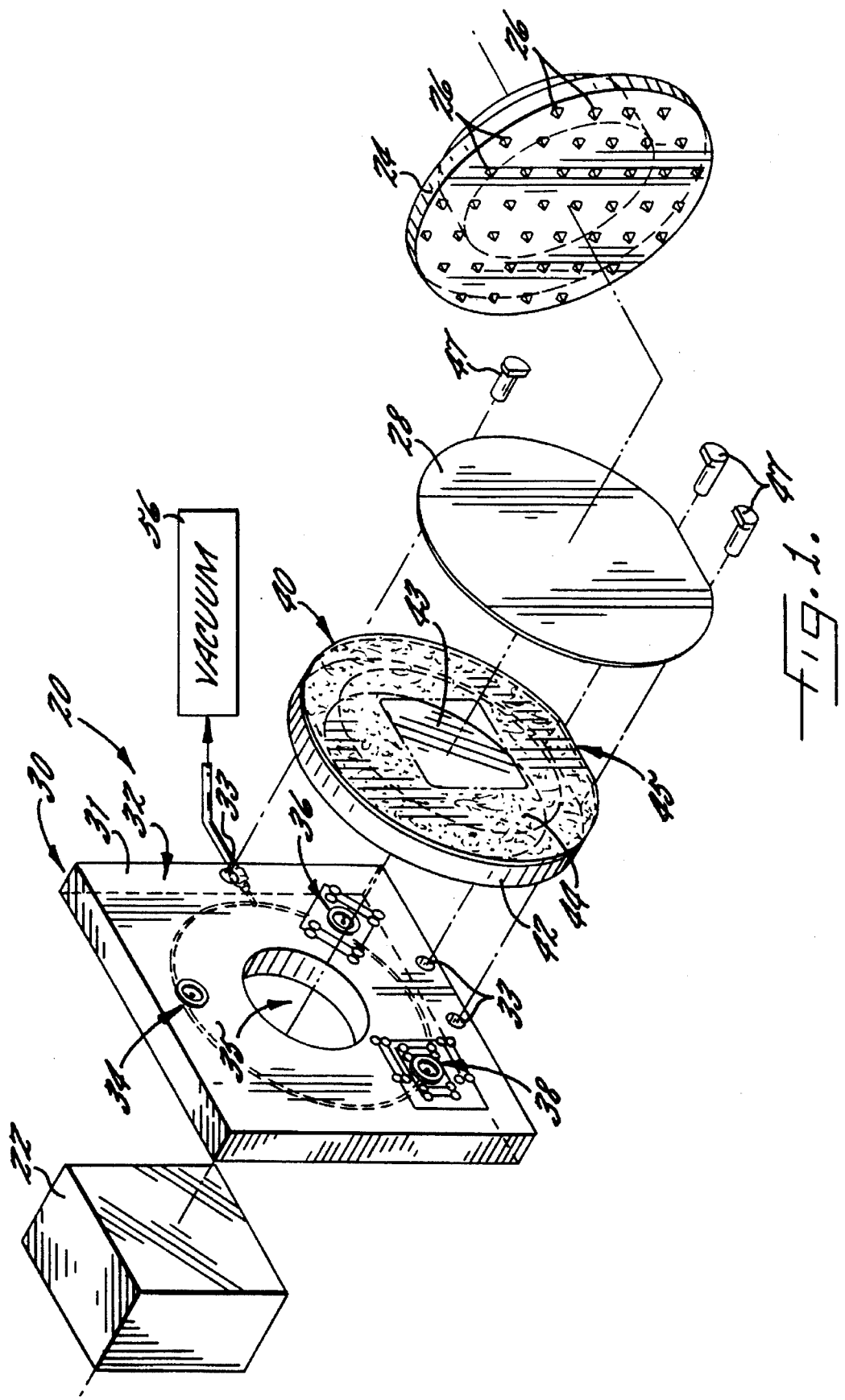
FIG. 1 is an exploded perspective view of a lithography assembly of the present invention.

FIG. 1 illustrates a lithography imaging apparatus 20, which comprises a radiation source 22, a substrate chuck 24 that secures a microelectronic substrate 28, and a mount 30 that secures a lithography mask 40. The radiation source 22, which preferably produces X-rays but can produce other forms of electromagnetic radiation suitable for lithography such as UV or visible optical radiation, provides imaging radiation along a radiation path, the direction of which is defined generally by the center line shown in FIGS. 1 and 2. The substrate chuck 24 secures the microelectronic substrate 28 in the radiation path. Illustratively and preferably, the substrate chuck 24 includes vacuum nozzles 26 that fix the microelectronic substrate 28 in the radiation path; however, other means known to those skilled in this art for securing a microelectronic substrate in position for imaging can also be used with the present invention. The microelectronic substrate 28 is typically a semiconductor material, but can be other materials, such as multilayer ceramic substrates or printed circuit boards, on which lithographic processes can be used, and preferably includes a photoresist layer on the surface to be imaged.

The mask mount 30 comprises a rigid support block 31 having a front surface 32, a trio of mounting pads 34, 36, and 38, and a vacuum 56. The support block includes a centrally located mount aperture 35 positioned in the radiation path through which radiation from the radiation source 22 passes. The mounting pads 34, 36, and 38 are arranged radially equidistant from the center line of the mount aperture 35 and circumferentially equidistant from one another. The support block 31 also includes three alignment apertures 33: one of which is located laterally of the mount aperture 35, and two of which are located beneath the mount aperture 35.

The lithography mask 40 comprises a glass ring 42 and a mask layer 46. A substantially square mask window 43 is centrally located in the mask layer 46 and provides a passageway for radiation from the radiation source 22. The mask window 43 includes both an opaque portion and a transparent portion; together, these portions define the desired pattern to be imaged on the microelectronic substrate 28. The mask 40 also includes a flat portion 45 at its lower edge. This flat portion 45 rest against two of a trio of alignment pins 47 that are inserted into alignment apertures 33. A third alignment pin 47 is inserted into the lateral alignment aperture 33. The alignment pins 47 ensure that the mask 40 is properly positioned relative to the center line.

The spatial relationship of the components of the lithography apparatus 20 is illustrated in FIG. 2. The radiation source 22 emits radiation, illustrated by the arrows shown in FIG. 2, that travels along the radiation path. The radiation first travels through the mount aperture 35, then through the glass ring 42 and the mask window 43 of the lithograph mask 40. Any radiation striking either the opaque portion of the mask window 43 or the mask layer 46 itself is lost from the radiation path; radiation striking the transparent portions of the mask window 43 passes therethrough. The radiation then crosses a small gap, typically about 10 to 50 microns in width, between the mask layer 46 and the microelectronic substrate 28, which is presented for imaging by the substrate chuck 24. Radiation reaching a portion of the microelectronic substrate 28 causes photoresist on the substrate to record an image at that location. Areas of the photoresist on the substrate 28 that are not irradiated by the radiation are not affected. As a result, the photoresist is developed in the desired pattern.

The mounting pad 36, which is exemplary of mounting pads 34 and 38, is shown in greater detail in FIGS. 3 through 5. The mounting pad 36 comprises an O-ring 50, preferably formed of a resilient flexible material, a centrally located registry pin 52, and a vacuum tunnel 54 having an outlet at the front surface 32 within the area defined by the O-ring 50. The vacuum tunnel 54 is fluidly connected with the vacuum source 56, which is capable of exerting a negative pressure at the vacuum tunnel outlet.

Securing of the lithograph mask 40 to the mounting pad 34 is illustrated in FIGS. 4 and 5. The lower surface of the glass ring 42 is lowered onto the O-ring 50. As the lower surface of the glass ring 42 contacts the O-ring 50, a seal is formed therebetween. Application of negative pressure via the vacuum 56 through the vacuum tunnel 54 draws the lower surface of the glass ring 42 toward and onto the free end of the registry pin 52, with the O-ring 50 flexing in response to this movement. The distance between the lower surface of the glass ring 42 and the mask mount front surface 32 is defined by the height of the registry pin 52, which provides a point load to the glass ring. The glass ring 42 need not be secured precisely perpendicularly to the registry pin 52, as the resilience of the O-ring 50 enables the glass ring 42 to remain sealed thereto. As a result, slight nonplanarities in the glass ring 42 can be accommodated by the mounting pad 36. The O-ring 50 also provides vibration dampening to the mask 40. Notably, the mask 40 is secured to the mask mount 30 without any structure of the mount 30 extending beyond the plane defined by the mask 40.

Figure 6:
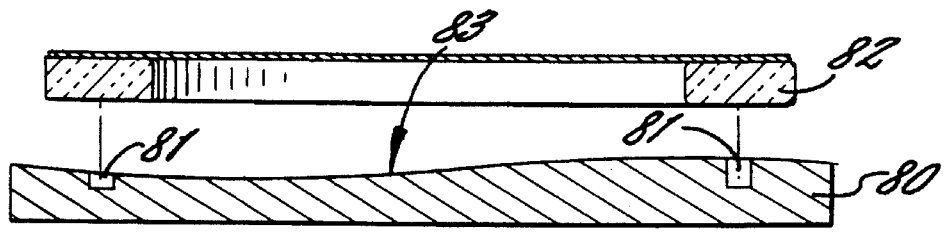
FIG. 6 is a cross-sectional view of a prior art lithography mask and mount.
Figure 7:
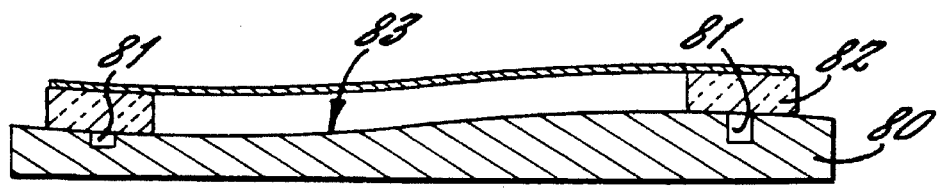
FIG. 7 is a cross-sectional view of the lithography mask and mount of FIG. 6 showing in exaggerated fashion the distortion of the lithography mask due to the nonplanar nature of the mount.

The distortion created in a lithograph mask through securing of the mask to a mount can be understood by the illustrations of a prior art mount 80 in FIGS. 6 and 7. The mount 80 is a simple vacuum chuck that secures a mask 82 via a vacuum applied thereto through vacuum tunnels 81. However, as is illustrated in FIGS. 6 and 7, if the front surface 83 of the mount 80 is uneven, securing of the mask 82 thereto causes distortion in the mask, which in turn adversely effects the etching process. Similarly, thermal expansion of the mask 82 relative to the mount 80 can also cause distortion.

The mounting pad 36 itself is adjustably connected to the support block 31 via a quartet of flexural hinges 70 (FIG. 3). Three interconnected inner slots 62, 63, 64 form three sides of a square around the mounting pad 36. These slots extend through the thickness of the support block 31. Each of the ends of each of these slots 62, 63, 64 merges with an aperture 65 that also extends through the thickness of the support block 31. Three outer slots 66, 67, 68, two of which (slots 66 and 68) are located adjacent opposing inner slots 62 and 64 and a third of which (slot 67) is located opposite the third inner slot 63, also form three sides of a square around the mounting pad 36. Four apertures 69 are positioned adjacent apertures 65 on outer slots 66, 68 so that a flexural hinge 70 is formed between each pair of adjacent apertures 65, 69.

The flexural hinges 70 are each able to flex so that the mounting pad 34 is free to move unidirectionally along a translation line parallel to the opposed inner and outer slots 63, 67 within the plane defined by the mount front surface 32. However, the flexural hinges 70 do not permit the mounting pad 36 to twist about its translation line or to move perpendicular thereto.

Figure 8:
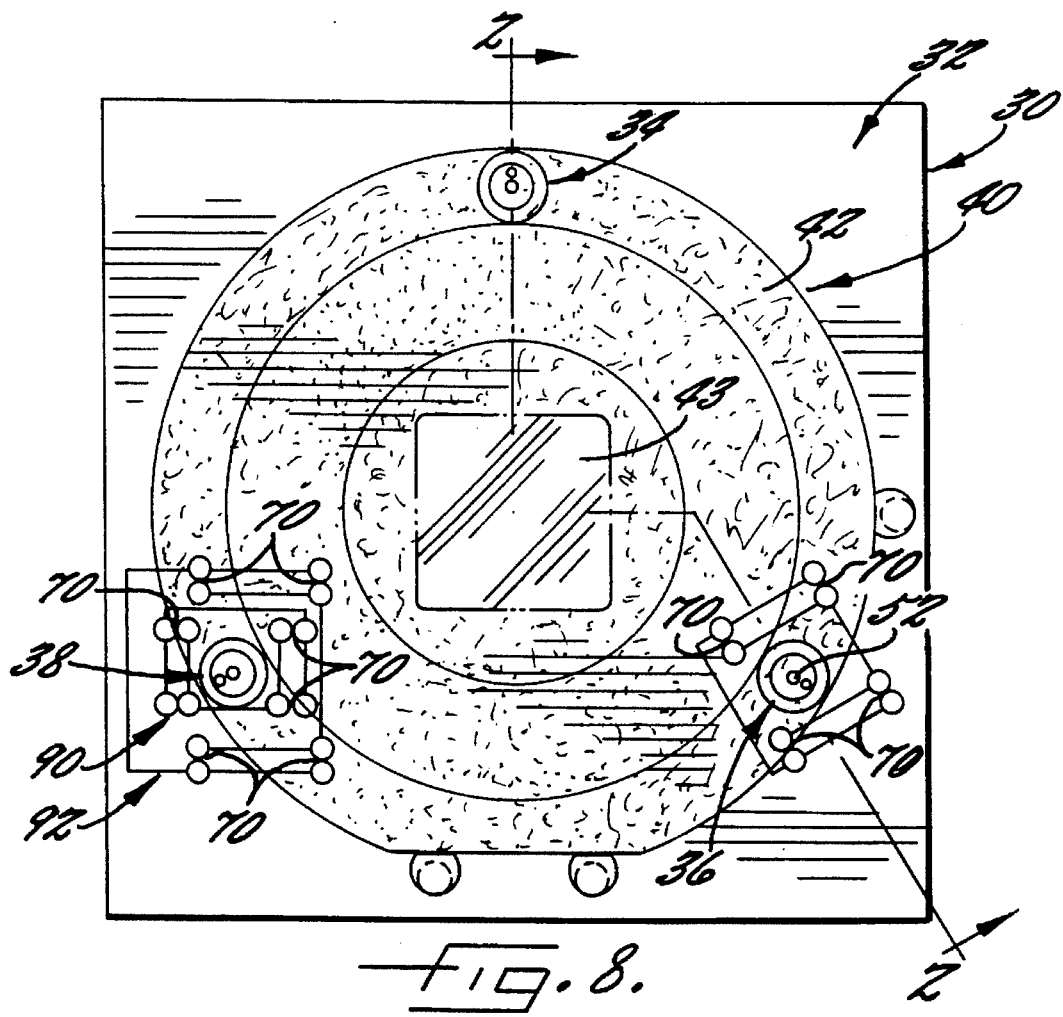
FIG. 8 is a top view of a lithography mount showing an immobile mounting pad, a unidirectional mounting pad, and a bidirectional mounting pad.

As shown in FIG. 8, the mounting pad 38 is connected to the support block 31 through a pair of cooperating flexural hinge quartets 90, 92. Each of these flexural hinge sets 90, 92 is configured similarly to those of the unidirectional mounting pad 36 illustrated in FIG. 3, but they are oriented so as to have translational directions that are perpendicular to one another. Consequently, the mounting pad 38 is free to move in any direction within the plane defined by the mount front surface 32. Also, the mounting pad 34 is fixed to the support block 34 and thus is immobile.

The combination of the immobile mounting pad 34, the unidirectional mounting pad 36, and the bidirectional mounting pad 38 provides the mount 30 with a configuration that can adjust to inplane dimensional changes in either the mask 40 or mask mount 30 after the two are joined. This mount provides enough constraints to hold the mask in position, without over constraining it and inducing stress. This kinematic mount configuration can be explained in terms of the principles of rigid body behavior. To remain fixed in space, a rigid body, such as the mask 40, must be constrained from translatory movement in three directions (defined by an arbitrary set of orthogonal x-, y- and z-axes), and constrained from rotating about any of these three axes. Each of these potential translations or rotations (totalling six) is deemed a "degree of freedom". If additional constraints are applied to the rigid body, the rigid body can respond only by deforming or deflecting to satisfy these constraints. One example of a mask mount with overconstraints is illustrated in FIGS. 6 and 7. When two nonplanar surfaces are forced to join and comply with each other, (such as is the case in FIGS. 6 and 7), overconstraints exist which stress the mask 40.

In contrast, the mount 30 of the present invention provides only six constraints corresponding to the six degrees of freedom, and thus does not force the mask 40 to deform in order to be secured thereto. Looking at the individual mounting pads, and assigning a Cartesian coordinate axis system so that the x-axis extends from the registry pin 52 of the immobile mounting pad 34 to the registry pin 52 of the unidirectional mounting pad 36, the y-axis extends perpendicularly to the x-axis within the plane of the page of FIG. 8, and the z-axis is normal to the plane of the page of FIG. 8, the registry pin 52 and the vacuum tunnel 54 of the immobile mounting pad 34 together provide constraints in the x, y, and z-directions. The unidirectional mounting pad 36 and the immobile mounting pad 34 combine to provide constraints to rotation about the y- and z-axes. The combination of the immobile mounting pad 34 and the bidirectional mounting pad 34 provides a constraint to rotation about the x-axis. However, these are the only constraints placed on the mask 40; the ability of the unidirectional mounting pad 36 and the bidirectional mounting pad 38 to shift within the plane of the mount front surface 32 enables the mask 40 to be secured to the mount 30 without being forced to deform. As a result, little to no stress is induced in the mask 40 due to its being secured to the mount 30, and therefore radiation passing through the mask 40 is not distorted.

Figure 9:
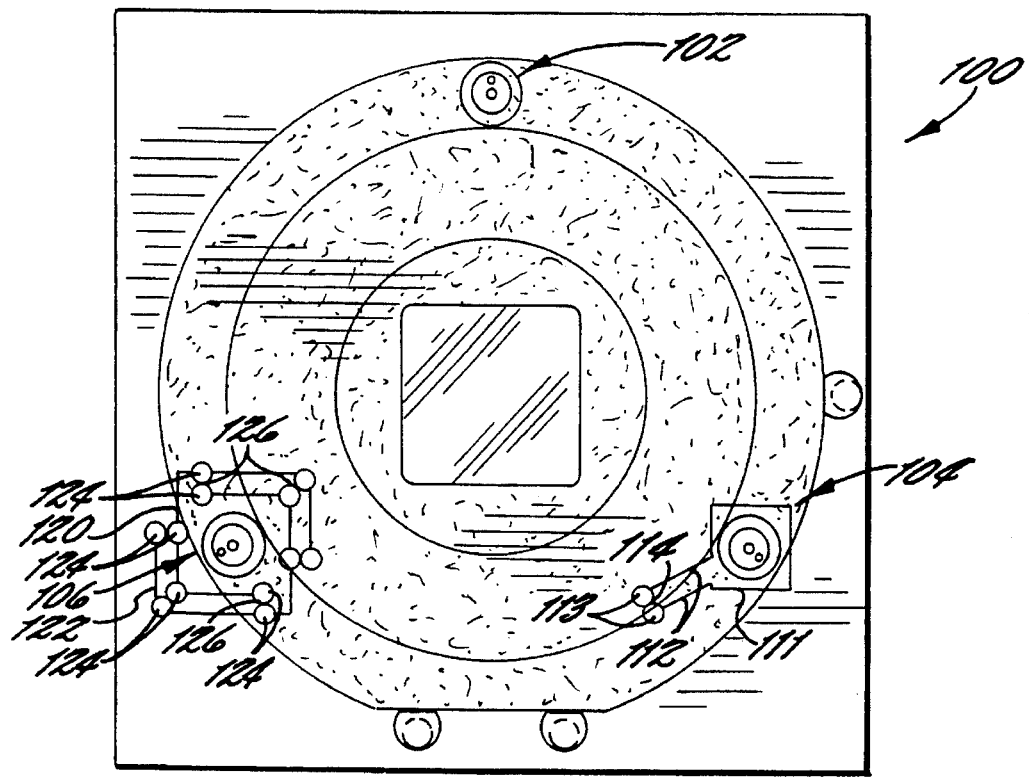
FIG. 9 is a top view of another embodiment of a lithography mount having an immobile mounting pad, a unidirectional mounting pad, and a bidirectional mounting pad.

FIG. 9 illustrates an additional mask mount 100 of the present invention which, like the embodiment illustrated in FIG. 8, includes an immobile mounting pad 102, and unidirectional mounting pad 104, and a bidirectional mounting pad 106; however, the flexural hinges 114, 126 connecting the mounting pads 104 and 106 to the mask mount 100 are configured somewhat differently. A set of slots 111 is arranged as a discontinuous square that surrounds the unidirectional mounting pad 104; a pair of parallel slots 112 extend from the discontinuity in the slots 111 to a pair of adjacent apertures 113 that define the flexural hinge 114. The flexural hinge 114 confines the movement of the unidirectional mounting pad 104 to that along a line parallel with a line between the immobile mounting pad 102 and the unidirectional mounting pad 104.

Two discontinuous square slots 120, 122 are arranged in a nested pattern about the bidirectional mounting pad 106, with their discontinuous portions being on opposite sides thereof. Each of the square slots 120, 122 includes six apertures 124, each of which is adjacent a corresponding aperture 124 of the other square slot. The adjacent pairs of apertures 124 define six flexural hinges 126. This flexural hinge configuration enables the bidirectional mounting pad 106 to move within the plane of the front surface of the mount 100.

Like the embodiment of the present invention illustrated in FIGS. 1 through 8, the combination of the immobile mounting pad 102, the unidirectional mounting pad 104, and the bidirectional mounting pad 106 enables the mount 100 to secure a lithography mask without inducing undesirable deformation therein. Consequently, the precision of lithographic processes is improved. Those skilled in this art will appreciate that, although the illustrated configurations of flexural hinges are preferred, other flexural hinge configurations known to those in this art, such as those disclosed in Paros et al., How to Design Flexural Hinges, *Machine Design* (Nov. 25, 1965), that provide in-plane flexure can also be used with the present invention.

Figure 10:
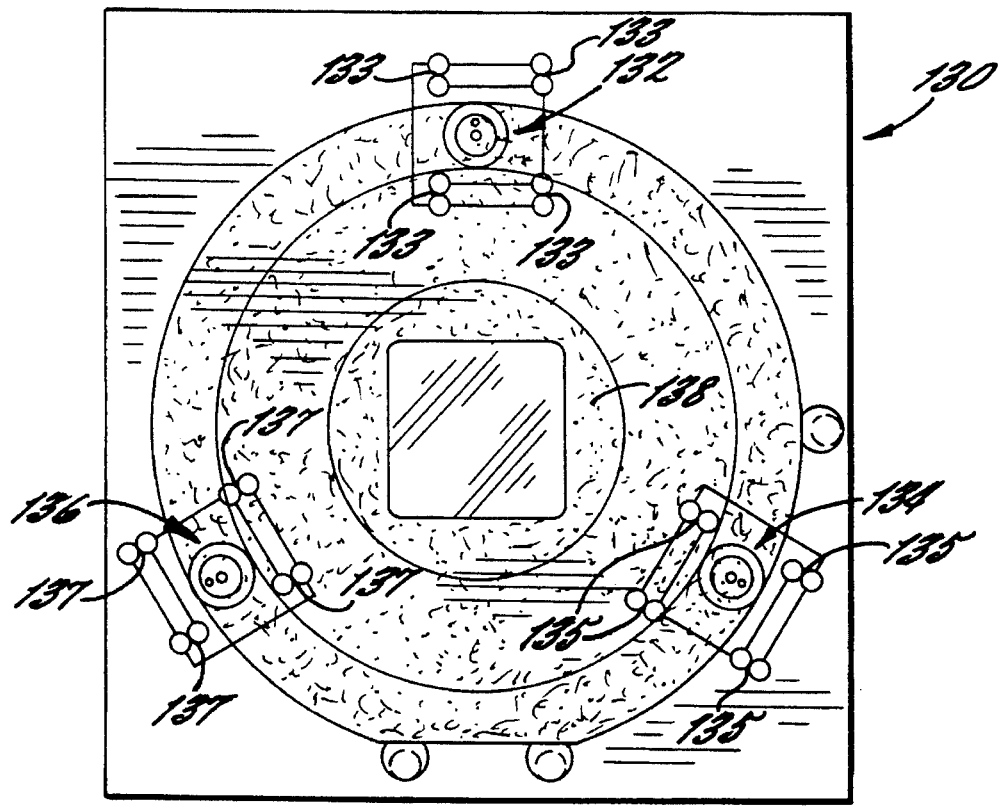
FIG. 10 is a top view of another embodiment of a lithography mount having three unidirectional mounting pads.

A further embodiment of the present invention is illustrated in FIG. 10. In this embodiment, a mount 130 of the same general configuration as the mounts illustrated in FIGS. 1 through 9 comprises three unidirectional mounting pads 132, 134, 136. Each of the mounting pads is positioned radially equidistant from the center of a mount aperture 138 and circumferentially equidistant from one another. Each of the mounting pads 132, 134, 136 is connected with the mount 130 through a respective flexural hinge quartet 133, 135, 137 of the configuration illustrated in FIG. 3. As a result, each mounting pad 132, 134, 136 is able to move unidirectionally along a line between the particular mounting pad and the center of the mount aperture within the plane defined by the front surface of the mount 130; thus, the movement direction of each of the mounting pads 132, 134, 136 from the other movement directions is separated by approximately 120 degrees.

Like the embodiments of FIGS. 1 through 9, this configuration enables the mounting pads 132, 134, 136 to adjust within this plane in response to the securing of a lithography mask and thus constrains a lithography mask secured to the mounting pads 132, 134, 136 only in the six degrees of freedom described above. Accordingly, securing of the mask does not induce deflection, and as a result undesirable stress, therein.

Any of the above-described embodiments are also suitable for other imaging processes in which an imaging or optical element can benefit from being mounted with little to no stress. Exemplary alternative processes include metrology systems, holographic systems, x-ray, optical mask inspection, or any system in which a pattern or optical property could be adversely influenced by mounting stresses.

The foregoing embodiments are illustrative of the present invention, and are not to be construed as limiting thereof. The invention is defined by the following claims, with equivalents of the claims to be included therein.

That which is claimed is:

1. A mount for an imaging mask comprising:

a support block;

a trio of mounting pads connected with said support block, the positions of at least two of said mounting pads being adjustable within a predetermined plane, each mounting pad including means for providing a point load to an imaging mask; and means for securing a generally planar imaging mask to said trio of mounting pads generally parallel to said predetermined plane, said securing means being operably associated with said trio of mounting pads;

wherein, upon securing of the imaging mask to said mounting pads so that the imaging mask is supported by said means for providing a point load, the positions of said at least two adjustable mounting pads adjust solely within said predetermined plane responsive to movement of the imaging mask relative to the support block so that the imaging mask is essentially undeformed.

2. The mount defined in claim 1, wherein said at least two adjustable mounting pads is two adjustable mounting pads, a first of which is adjustable in a first linear direction, and a second of which is adjustable in the first linear direction and in a second linear direction that is perpendicular to the first linear direction.

3. The mount defined in claim 2, further comprising a flexural hinge connecting said first mounting pad to said support block and a pair of perpendicularly oriented cooperating flexural hinges connecting said second mounting pad to said support block.

4. The mount defined in claim 1, wherein said at least two adjustable mounting pads is three adjustable mounting pads, each of which is adjustable in a respective linear direction, each of the linear directions being separated by approximately 120 degrees from each of the other linear directions.

5. The mount defined in claim 4, further comprising a trio of flexural hinges, each of which connects a respective one of said trio of mounting pads.

6. The mount defined in claim 1, wherein each of said trio of mounting pads further comprises a resilient gasket surrounding said means for providing a point load.

7. The mount defined in claim 1, wherein said securing means comprises vacuum means operably connected with each of said trio of mounting pads.

8. The mount defined in claim 1, wherein said means for providing a point load comprises a registry pin extending toward the imaging mask essentially normal to said predetermined plane, a free end of said registry pin defining the distance between the mounted imaging mask and said mount and providing a point support for the mask.

9. A mount for a imaging mask comprising:

a support block;

a trio of mounting pads connected with said support block, at least two of said mounting pads being connected to said support block so that their respective positions are adjustable solely within a predetermined plane, each of said mounting pads including means for securing a generally planar imaging mask generally parallel to said predetermined plane, each of said mounting pads further including means for providing a point load to the imaging mask;

wherein, upon securing of the imaging mask to said mounting pads supported by said load for providing a point load, the positions of said at least two adjustable mounting pads adjust within the predetermined plane responsive to movement of the imaging mask relative to the support block so that the mask is essentially undeformed, thereby reducing distortion of radiation passing through the mask.

10. The mount defined in claim 9, wherein said at least two adjustable mounting pads is two adjustable mounting pads, a first of which is adjustable in a first linear direction, and a second of which is adjustable in the first linear direction and in a second linear direction that is perpendicular to the first linear direction.

11. The mount defined in claim 10, further comprising a flexural hinge connecting said first mounting pad to said support block and a pair of perpendicularly oriented cooperating flexural hinges connecting said second mounting pad to said support block.

12. The mount defined in claim 9, wherein said at least two adjustable mounting pads is three adjustable mounting pads, each of which is adjustable in a respective linear direction, each of the linear directions being separated by approximately 120 degrees from each of the other linear directions.

13. The mount defined in claim 12, further comprising a trio of flexural hinges, each of which connects a respective one of said trio of mounting pads.

14. The mount defined in claim 9, wherein at least one of said trio of mounting pads further comprises a registry pin extending toward the imaging mask essentially normal to said predetermined plane, a free end of said registry pin defining the distance between the mounted imaging mask and said mount and providing a point support for the mask.

15. The mount defined in claim 9, wherein each of said trio of mounting pads further comprises a resilient gasket.

16. The mount defined in claim 9, wherein said securing means comprises vacuum means operably connected with each of said trio of mounting pads.

17. A mount for a imaging mask comprising:
   a support block;
   a trio of mounting pads connected with said support block, at least two of said mounting pads being connected to said support block so that their respective positions are adjustable within a predetermined plane, each of said mounting pads including means for securing a generally planar imaging mask generally parallel to said predetermined plane and further including means for providing a point load to said imaging mask, said securing means and said means for providing a point load being configured to be devoid of projections beyond the plane defined by the imaging mask;
   wherein the positions of said at least two adjustable mounting pads adjust solely within the predetermined plane responsive to securing of the imaging mask thereto so that essentially no stress is induced in the imaging mask due to the securing and movement of the imaging mask relative to the support block, thereby reducing distortion of radiation passing through the mask.

18. The mount defined in claim 17, wherein said at least two adjustable mounting pads is two adjustable mounting pads, a first of which is adjustable in a first linear direction, and a second of which is adjustable in the first linear direction and in a second linear direction that is perpendicular to the first linear direction.

19. The mount defined in claim 18, further comprising a flexural hinge connecting said first mounting pad to said support block and a pair of perpendicularly oriented cooperating flexural hinges connecting said second mounting pad to said support block.

20. The mount defined in claim 17, wherein said at least two adjustable mounting pads is three adjustable mounting pads, each of which is adjustable in a respective linear direction, each of the linear directions being separated by approximately 120 degrees from each of the other linear directions.

21. The mount defined in claim 20, further comprising a trio of flexural hinges, each of which connects a respective one of said trio of mounting pads.

22. The mount defined in claim 17, wherein said means for providing a point load comprises a registry pin extending toward the imaging mask essentially normal to said predetermined plane, a free end of said registry pin defining the distance between the mounted imaging mask and said mount and providing a point support for the mask.

23. The mount defined in claim 17, wherein each of said trio of mounting pads further comprises a resilient gasket surrounding said means for providing a point load.

24. The mount defined in claim 17, wherein said securing means comprises vacuum means operably connected with each of said trio of mounting pads.

25. The mount defined in claim 17, in combination with an imaging mask secured thereto at said trio of mounting pads.

\* \* \* \* \*

UNITED STATES PATENT AND TRADEMARK OFFICE
CERTIFICATE OF CORRECTION

PATENT NO. :   5,536,559
DATED      :   July 16, 1996
INVENTOR(S):   Cerrina et al.

It is certified that error appears in the above-identified patent and that said Letters Patent is hereby corrected as shown below:

Column 1, line 5,

--This invention was made with United States government support awarded by NSF Grant #ECS-8921165 and ONR Grant No. N00014-91-J-1876. The United States Government has certain rights in this invention.--

Signed and Sealed this

Twelfth Day of November, 1996

Attest:

BRUCE LEHMAN

*Attesting Officer*           *Commissioner of Patents and Trademarks*